(12) United States Patent
Wada et al.

(10) Patent No.: US 9,087,969 B2
(45) Date of Patent: Jul. 21, 2015

(54) LIGHT-EMITTING DEVICE

(75) Inventors: Satoshi Wada, Aichi-ken (JP); Miki Moriyama, Aichi-ken (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 668 days.

(21) Appl. No.: 12/659,565

(22) Filed: Mar. 12, 2010

(65) Prior Publication Data
US 2010/0237369 A1 Sep. 23, 2010

(30) Foreign Application Priority Data

Mar. 17, 2009 (JP) .................... 2009-065131

(51) Int. Cl.
| | |
|---|---|
| *H01L 33/00* | (2010.01) |
| *H01L 33/56* | (2010.01) |
| *F21K 99/00* | (2010.01) |
| *H01L 23/00* | (2006.01) |
| *F21V 29/74* | (2015.01) |
| *F21V 29/89* | (2015.01) |
| *H01L 25/075* | (2006.01) |
| *F21Y 101/02* | (2006.01) |
| *F21Y 103/00* | (2006.01) |
| *F21Y 105/00* | (2006.01) |

(52) U.S. Cl.
CPC . *H01L 33/56* (2013.01); *F21K 9/00* (2013.01); *F21V 29/74* (2015.01); *F21V 29/89* (2015.01); *H01L 24/97* (2013.01); *F21Y 2101/02* (2013.01); *F21Y 2103/003* (2013.01); *F21Y 2105/001* (2013.01); *H01L 25/0753* (2013.01)

(58) Field of Classification Search
CPC ..... H01L 51/50; H01L 2251/50; H01L 33/00; H01L 33/50; H01L 33/52; H01L 33/56; H01L 33/64; H01L 2924/181; H01L 2924/186; H01L 25/0753; H01L 24/97; F21K 9/00; F21Y 2103/003; F21Y 2105/001; F21V 29/74
USPC .......... 257/79, 98, 99, E33.056, E33.067, 13, 257/40, 59, 81, 84, 88, 93, 100, 678, 687, 257/E33.01, E33.059, E33.061, E33.073, 257/E33.075; 362/257; 313/483
See application file for complete search history.

(56) References Cited

U.S. PATENT DOCUMENTS

| | | | | |
|---|---|---|---|---|
| 6,498,355 | B1 * | 12/2002 | Harrah et al. | 257/99 |
| 2002/0088985 | A1 * | 7/2002 | Komoto et al. | 257/99 |
| 2004/0257797 | A1 * | 12/2004 | Suehiro et al. | 362/34 |
| 2005/0161771 | A1 | 7/2005 | Suehiro et al. | |
| 2006/0171152 | A1 * | 8/2006 | Suehiro et al. | 362/363 |
| 2006/0261364 | A1 | 11/2006 | Suehiro et al. | |
| 2008/0283860 | A1 * | 11/2008 | Suehiro et al. | 257/98 |

FOREIGN PATENT DOCUMENTS

| | | |
|---|---|---|
| JP | 2006-344450 | 12/2006 |
| WO | WO 2004/082036 A1 | 9/2004 |

* cited by examiner

*Primary Examiner* — Galina Yushina
(74) *Attorney, Agent, or Firm* — McGinn IP Law Group, PLLC.

(57) ABSTRACT

A light-emitting device includes a substrate, a light-emitting element mounted on a first flat surface of the substrate, and a glass sealing member for sealing the light-emitting element, wherein the sealing member is in contact with the first flat surface and a side surface of the substrate and a second flat surface of the surface opposite to the first flat surface is exposed.

18 Claims, 8 Drawing Sheets

LIGHT-EMITTING DEVICE

The present application is based on Japanese Patent Application No. 2009-065131 filed on Mar. 17, 2009, the entire contents of which are incorporated herein by reference.

BACKGROUND OF THE INVENTION

1. Field of the Invention

The invention relates to a modification of a light-emitting device.

2. Related Art

Conventionally, a LED chip mounted on a substrate is sealed with glass, thereby forming a LED lamp. WO2004-982036 discloses a method of forming plural LED lamps in which plural LED lamps arranged in a lattice pattern on a plate-like ceramic substrate are collectively sealed with glass and dried. In addition, JP-A 2006-344450 discloses a linear light source formed by linearly arranging plural LED chips on a linear substrate and collectively sealing with glass.

In accordance with use of LED lamp in various light emitting situations, flexibility of light extracting direction and heat dissipation for high brightness are required to be improved in the LED lamp. WO2004-982036 and JP-A 2006-344450 are not configured to actively extract light in a lower surface direction of a substrate on which a LED element is mounted, and the flexibility of light extracting direction is poor. In addition, since the heat dissipation structure is not provided, the heat dissipation is not improved.

In the meantime, a linear expansion coefficient of the substrate for mounting on the LED element is different from that of a glass material for sealing the LED element. As a result, when the glass material is bonded by thermal compression and cooled during a sealing process, a difference is generated between the amount of shrinkage of the substrate and that of the glass material. The difference in the amount of shrinkage becomes significant with increasing a bonded surface of the substrate to the glass material for sealing. In the configuration of WO2004-982036 and JP-A 2006-344450, since the plural LED chips are correctively sealed with glass, the difference in the amount of shrinkage between the substrate and the glass material for sealing becomes significant, and a crack is generated in the sealing glass after cooling. This causes a decrease in yield.

Therefore, one object of the invention is to improve flexibility of light extracting direction of a light-emitting device. In addition, another object is to improved heat dissipation of the light-emitting device. Further another object is to provide a light-emitting device in which a crack is not generated in the sealing material.

THE SUMMARY OF THE INVENTION

According to a first aspect of the invention, a light-emitting device, comprises:
a substrate;
a light-emitting element mounted on a first flat surface of the substrate; and
a glass sealing member for sealing the light-emitting element,
wherein the sealing member is in contact with the first flat surface and a side surface of the substrate; and
a second flat surface of the surface opposite to the first flat surface is exposed.

Points of the Invention

In the light-emitting device which is a first aspect of the invention, a second flat surface of a substrate opposite to a first flat surface for mounting a light-emitting element is exposed. As a result, the exposed portion functions as a heat extracting portion for conducting heat of the light-emitting element to the outside, which contributes to an improvement of heat dissipation. In addition, since a sealing member wraps around a side surface of the substrate, light extraction in side and lower surface directions of the substrate is enhanced.

In the light-emitting device which is a second aspect of the invention, the substrate is arranged so as to have a window portion in which the sealing member is filled, in addition to the configuration of the first aspect. In such a configuration, a contact area of the substrate and the sealing member is smaller than the case without window portion. As a result, a difference in an amount of expansion/shrinkage caused by a difference between a linear expansion coefficient of the substrate and that of the sealing member is decreased, thereby reducing generation of cracks and improving yield. In addition, even in the case where there is a difference between the linear expansion coefficient of the substrate and that of the sealing member, since the generation of cracks is reduced, it is possible to use a substrate or a sealing member which is conventionally difficult to use due to generation of cracks.

BRIEF DESCRIPTION OF THE DRAWINGS

Next the present invention will be explained in more detail in conjunction with appended drawings, wherein.

DESCRIPTION OF THE PREFERRED EMBODIMENTS

Figure 1:
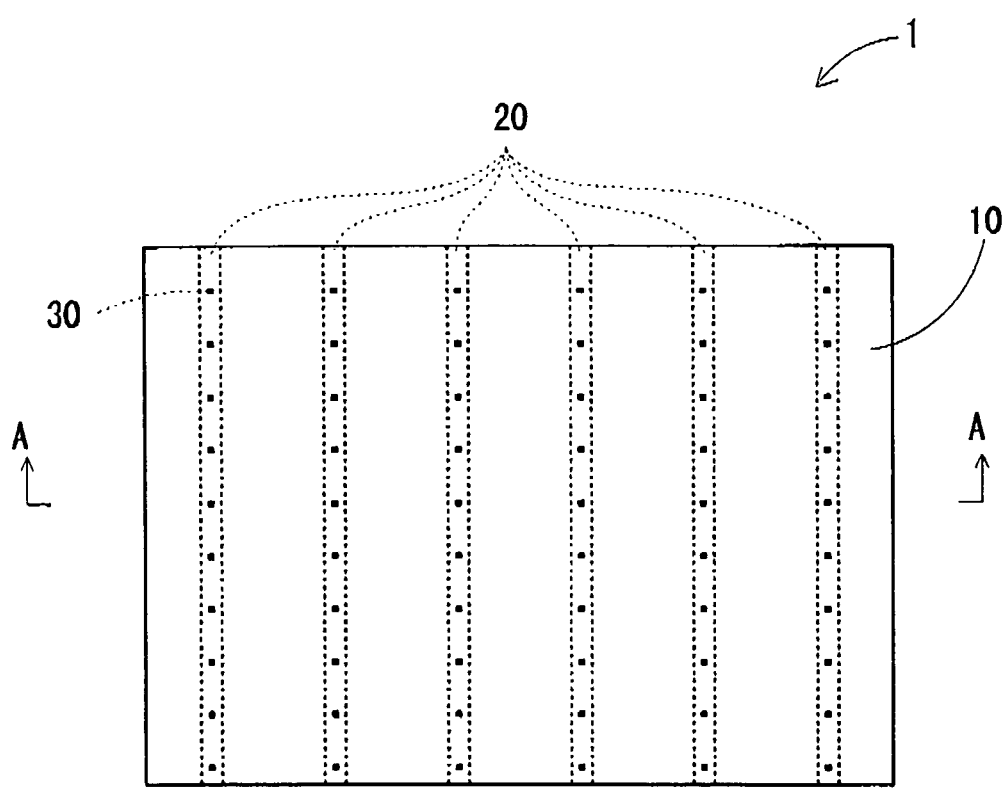
FIG. 1 is a top view showing a light-emitting device 1 in a first preferred embodiment of the present invention.
Figure 2:
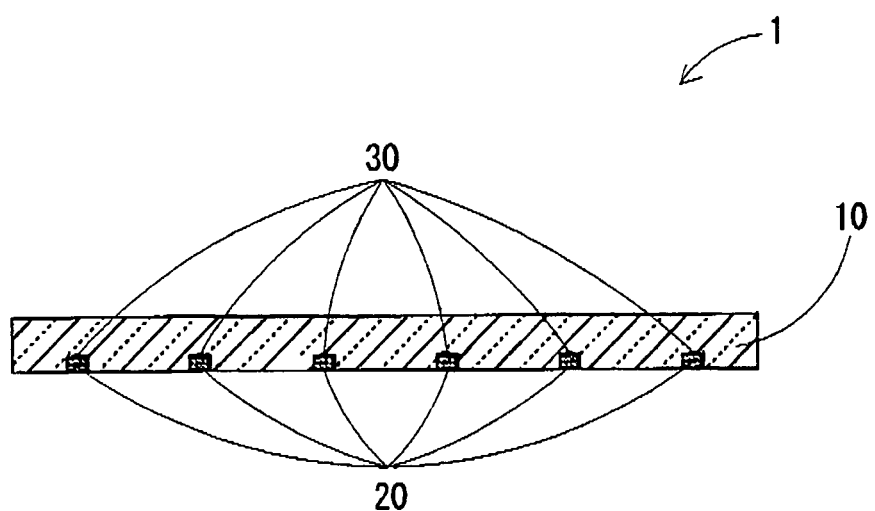
FIG. 2 is a cross sectional view taken on line A-A of FIG. 1.

FIG. 1 is a top view showing a light-emitting device 1 in a first embodiment of the invention, and FIG. 2 is a cross sectional view taken on line A-A of FIG. 1. The light-emitting device 1 is provided with a sealing glass 10, a substrate 20 and a light-emitting element 30. As shown in FIG. 1, the sealing glass 10 has a rectangular shape in a plan view. A material of the sealing glass 10 is colorless and transparent glass. The substrate 20 is formed of ceramic and is a reed-shaped long object in a plan view. Six substrates 20 are arranged in parallel in a longitudinal direction at equal intervals. The light-emitting element 30 is mounted on a mounting surface of the substrate 20. Plural light-emitting elements 30 are provided along a longitudinal direction of the substrate 20 at equal intervals, and in the present embodiment, ten light-emitting elements 30 are provided per substrate 20. The light-emitting element 30 is a flip-chip type LED chip. As shown in FIG. 2, the sealing glass 10 covers a mounting surface of the substrate 20 for mounting the light-emitting element 30 and a side surface of the substrate 20, and a surface of the substrate 20 opposite to the mounting surface is exposed. Thus, the light-emitting element 30 is buried in the sealing glass 10.

According to the light-emitting device 1, an exposed surface of the substrate 20 functions as a heat extracting portion for conducting heat of the light-emitting element to the outside, which contributes to an improvement of heat dissipation. In addition, since the sealing glass 10 wraps around the side surface of the substrate 20, light extraction in side and lower surface directions of the substrate 20 is enhanced.

Figure 3:
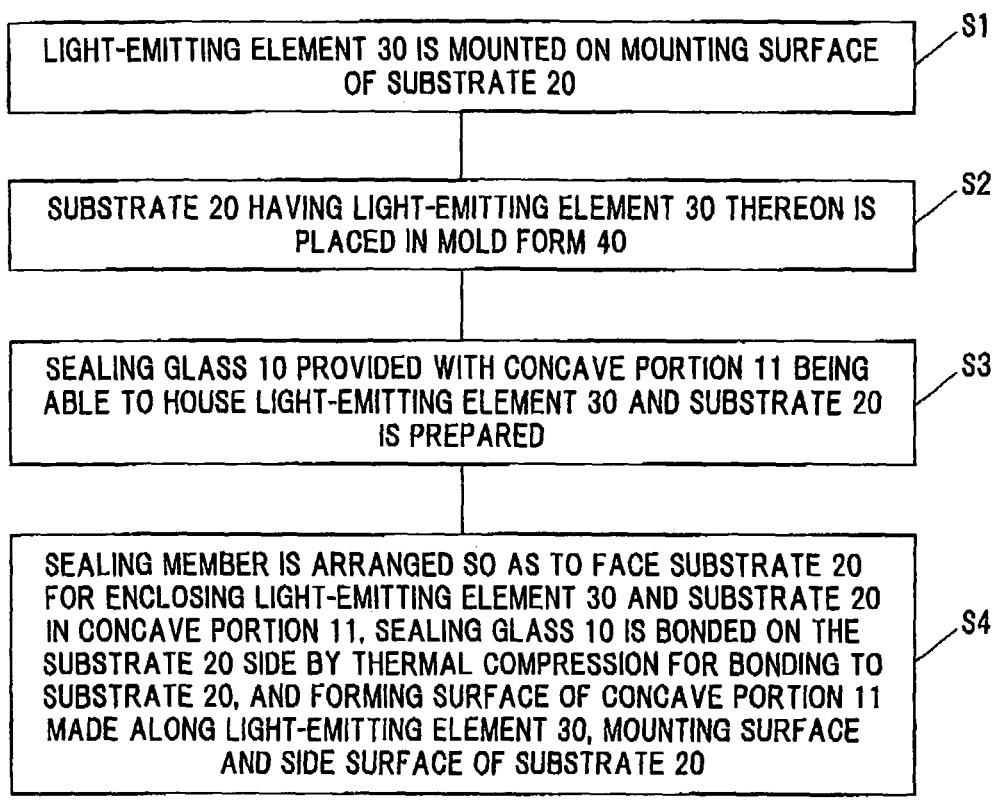
FIG. 3 is a flow diagram of a method of manufacturing the light-emitting device 1.

A method of manufacturing the light-emitting device 1 will be described below. FIG. 3 is a flow diagram of a method of manufacturing the light-emitting device 1.

Firstly, the light-emitting elements 30 are flip-mounted on the mounting surface of the substrate 20 which is a long object (a mounting process S1). Ten light-emitting elements 30 are used and are linearly arranged along a longitudinal direction of the substrate 20 as shown in FIG. 1.

Figure 4A:
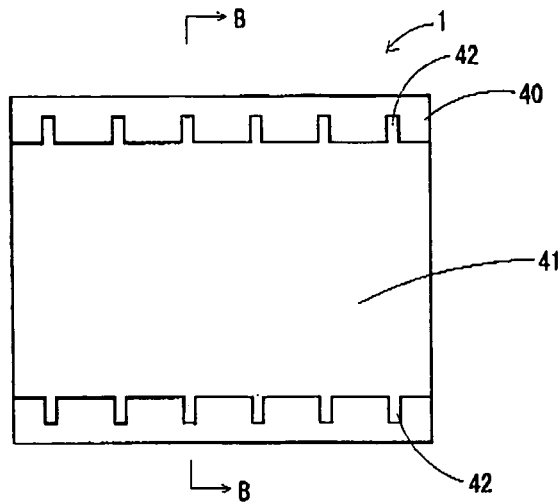
FIG. 4(A) is a plan view showing a mold form 40.
Figure 4B:
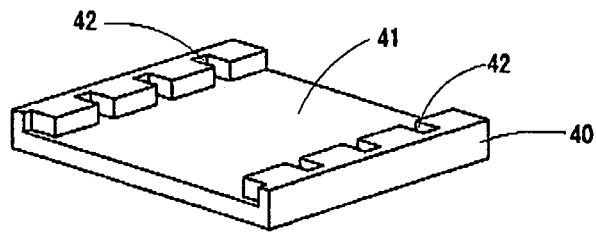
FIG. 4(B) is a perspective cross sectional view taken on line B-B.
Figure 4C:
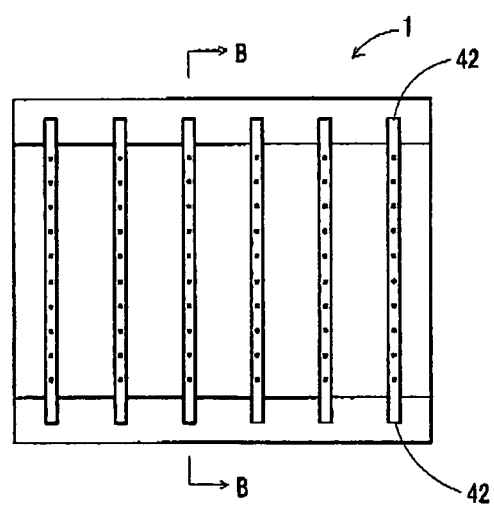
FIG. 4(C) shows a plan view of the mold form 40.
Figure 4D:
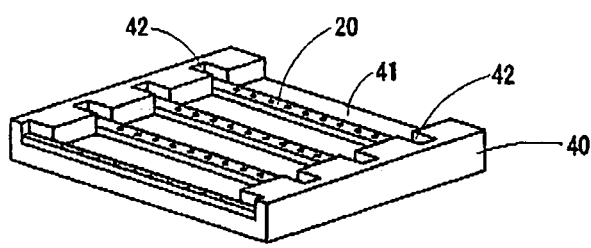
FIG. 4(D) shows a partial perspective cross sectional view taken on line B-B.

Next, the substrate 20 having the light-emitting elements 30 mounted thereon is placed in a mold form 40 (a substrate placing process S2). FIG. 4(A) is a plan view showing a mold form 40 and FIG. 4(B) is a perspective cross sectional view taken on line B-B. The mold form 40 is in a rectangular shape in a plan view and has a concave portion 41 having a predetermined depth at a middle portion of the mold form 40. An outer edge of the concave portion 41 is formed substantially parallel to that of the mold form 40. In this regard, however, six trenches 42 communication with the concave portion 41 are further each provided at one end portion and at an opposite end portion (another end portion) at equal intervals. A width of a bottom of the trench 42 is substantially same as the substrate 20 and is slightly extended from the bottom to the top (on a front side on the paper surface of FIG. 4(A)). The trenches 42 facing each other at the one and other end portions of the concave portion 41 are linearly arrayed in parallel to an outer wall of the concave portion 41 in which the trench 42 is not provided. A distance between end portions of the facing trenches 42 is substantially same as a length of the substrate 20, and the substrate 20 is placed in the mold form 40 via the trench 42. FIG. 4(C) shows a plan view of the mold form 40 and FIG. 4(D) shows a partial perspective cross sectional view taken on line B-B. As shown in FIG. 4(C), six substrates 20 are placed in parallel at equal intervals in the concave portion 41 of the mold form 40.

Figure 5A:
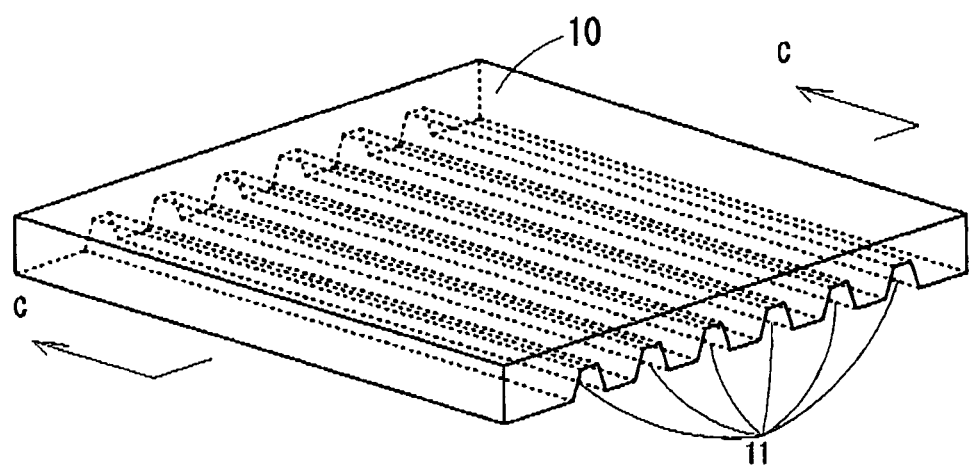
FIG. 5(A) is a perspective view showing a sealing glass 10 and FIG. 5(B) is a cross sectional view taken on line C-C of FIG. 5(A)
Figure 5B:
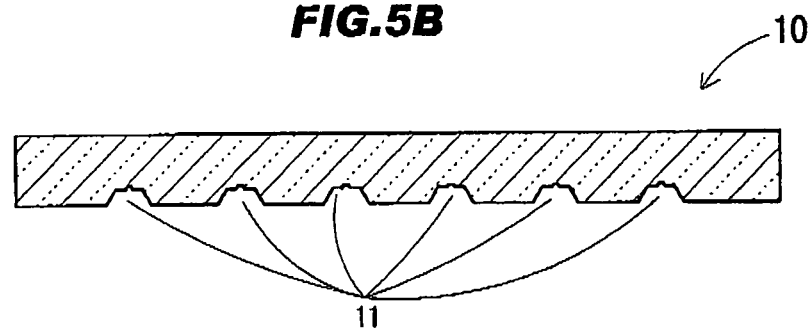

Next, FIG. 5(A) is a perspective view showing a sealing glass 10 and FIG. 5(B) is a cross sectional view taken on line C-C of FIG. 5(A). As shown in FIG. 5(B), a sealing glass provided with a concave portion 11 being capable of enclosing the light-emitting element 30 and the substrate 20 is prepared (a sealing glass preparation process S3). The sealing glass 10 has a substantially plate shape and an outer shape thereof is substantially same as an outer shape of the concave portion 41 of the mold form 40. The concave portion 11 is provided on one plate surface of the sealing glass 10 (a surface on a lower side of the paper surface of FIG. 5(B)). The concave portion 11 is provided along an arrangement direction of the substrate 20 and is formed slightly larger than outer shapes of the light-emitting element 30 and the substrate 20 for enclosing them.

Figure 6A:
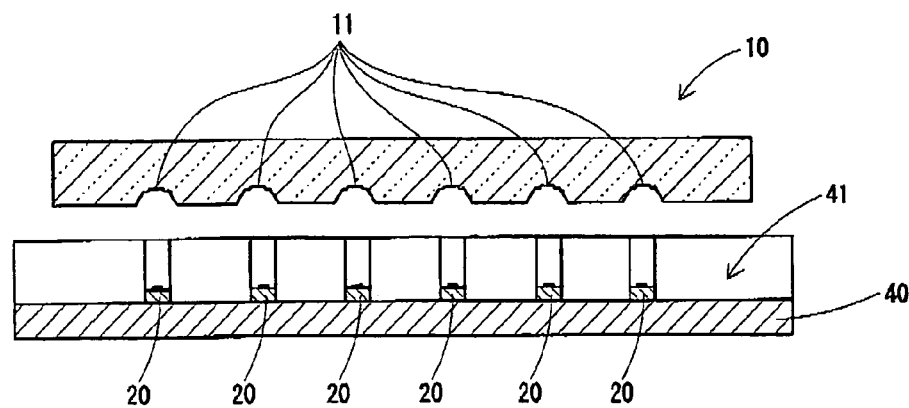
FIGS. 6(A) to (C) are views showing a sealing process.
Figure 6B:
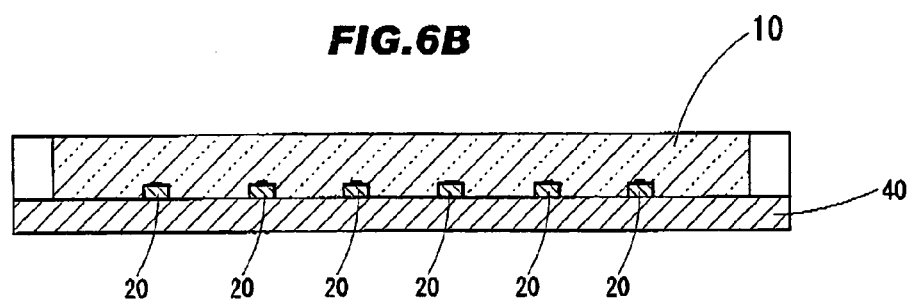
Figure 6C:
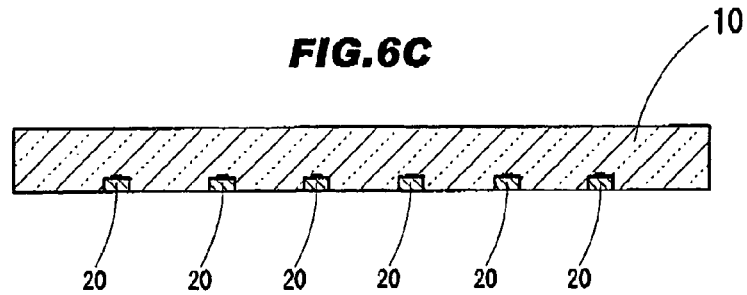

Next. FIG. 6 is a view showing a sealing process. The sealing glass 10 is positioned facing the placed substrate 20 so as to house the light-emitting element 30 and the substrate 20 in the concave portion 11 (see FIG. 6(A)) and is arranged in the concave portion 41 of the mold form 40. The sealing glass 10 is bonded on the substrate 20 side by thermal compression so as to be bonded to the substrate 20, and a forming surface of the concave portion 11 is made along the light-emitting element 30 as well as mounting and side surfaces of the substrate 20 (see FIG. 6(B), a sealing process S4). The mold form 40 is then removed, thereby manufacturing the light-emitting device 1.

According to the above method of manufacturing the light-emitting device 1, as shown in FIG. 4(C), when the six substrates 20 are placed in the mold form 40, the six substrates 20 are arranged only on a portion of the bottom of the concave portion 41, thus, a region (i.e., between adjacent substrates) not having the six substrates substrate 20 arranged therein (a window portion) is present on the bottom of the concave portion 41. Due to the presence of the window portion, a contact area of each the six substrates 20 and the sealing member 10 is smaller than the case where such a window portion does not exist (i.e., the case where the substrate is placed in the whole area of the bottom of the concave portion 41). As a result, a difference in an amount of expansion/shrinkage caused by a difference between a linear expansion coefficient of the substrate 20 and that of the sealing glass is decreased, thereby reducing generation of cracks and improving yield.

The light-emitting device 1 of the present embodiment is configured as a module provided with plural light-emitting elements 30, and it is possible to form a single light-emitting device by dicing each or a predetermined number of light-emitting elements 30 after the sealing process.

Figure 7A:
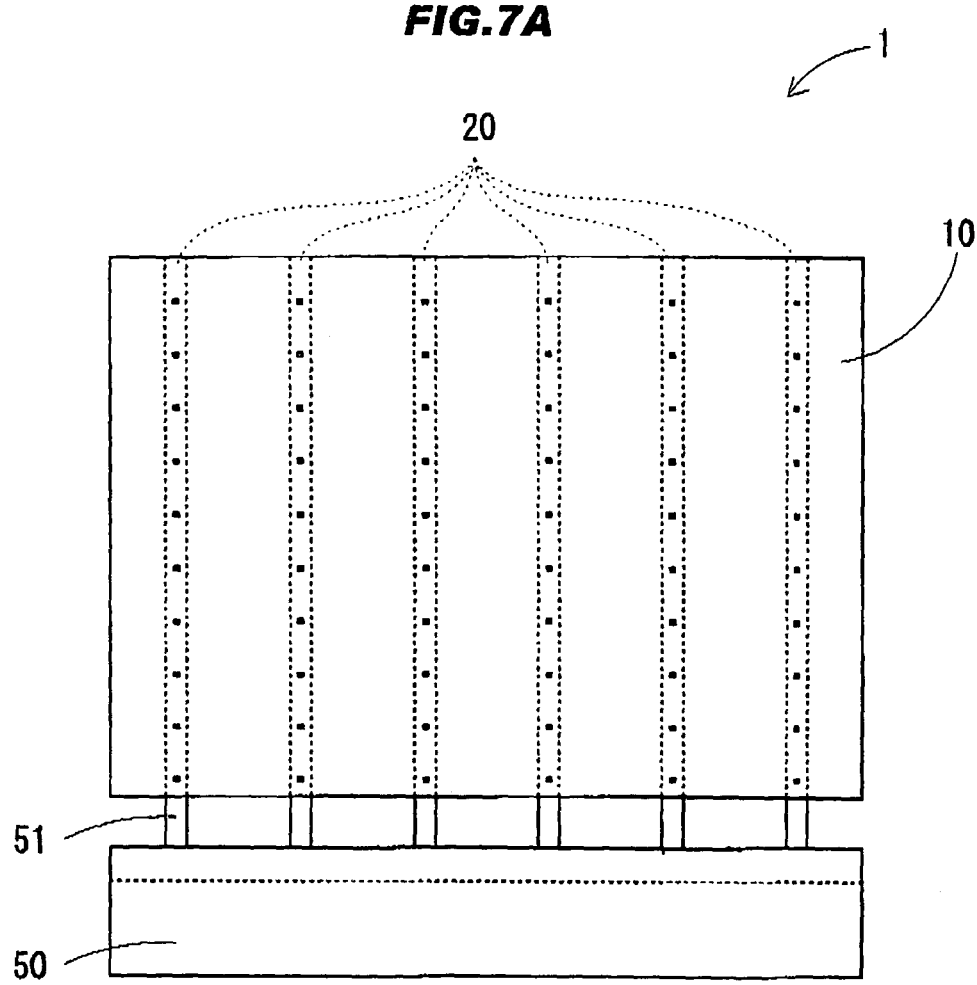
FIGS. 7(A) to (B) are views showing a modification of the invention.
Figure 7B:
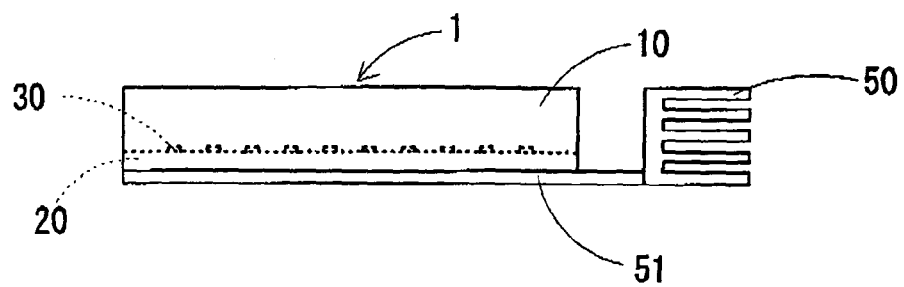

FIG. 7 is a view showing a modification of the invention. In the present modification, the light-emitting device 1 is further provided with a heat sink 50 and a heat extraction member 51. The heat extraction member 51 is a metal plate formed of aluminum, and is bonded to a lower surface of the light-emitting device 1 where the substrate 20 is exposed, and an end portion of the heat extraction member 51 is connected to the heat sink 50. As a result, the heat dissipation of the light-emitting device 1 is further improved.

Although an upper surface of the sealing glass 10 (a surface opposite to the surface where the substrate 20 is exposed) is flat in the light-emitting device 1 of the invention, it is not limited thereto. Hence, it can be a lens surface, e.g., a cylindrical lens surface. FIG. 8 shows a modification in which the sealing glass 10 has a cylindrical lens surface. In a light-emitting device 100 shown in FIG. 8(A), a surface of a sealing glass 15 on the opposite side of the substrate 20 is a cylindrical lens surface 15a. The cylindrical lens surface 15a as described above can be formed in the sealing glass preparation process (S3) by using a forming die having a shape corresponding to the cylindrical lens surface 15a. An individual light-emitting device 100a may be formed by further dicing the light-emitting device 100 shown in FIG. 8(A).

Figure 8A:
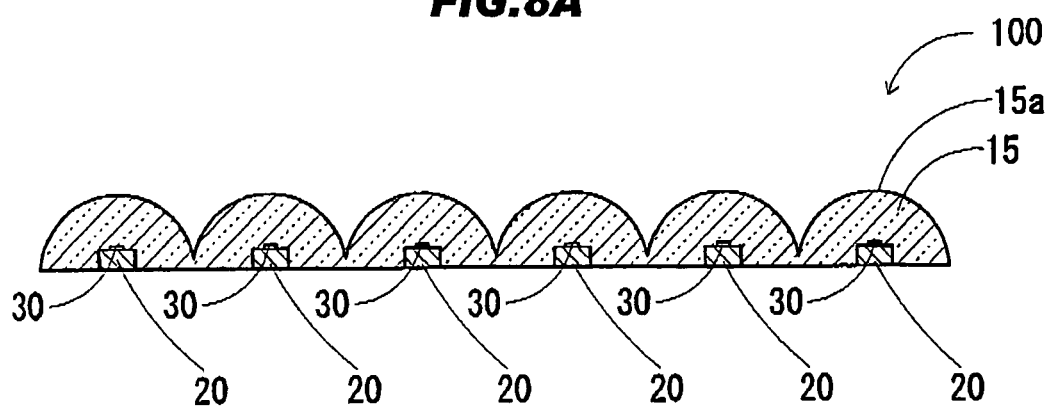
FIGS. 8(A) to (E) are cross sectional views showing a light-emitting device in the modification.
Figure 8B:
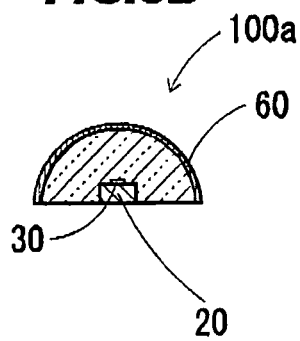

Furthermore, a reflective layer may be provided on the cylindrical lens surface 15a. FIG. 8(B) shows a modification in which a reflective layer is provided. The light-emitting device 100a includes a reflective layer 60 on the cylindrical lens surface 15a. The reflective layer 60 is formed by aluminum deposition. By the reflective layer 60, the light of the light-emitting device 100a is emitted from a lower surface thereof, i.e., a surface on a side where the substrate 20 is exposed.

Figure 8C:
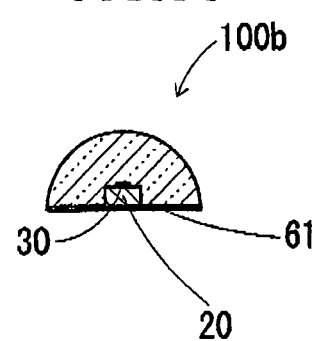

The reflective layer may be provided on a lower surface of the light-emitting device 100a. FIG. 8(C) shows a modification in which a light-emitting device 100b includes a reflective layer 61 on the lower surface thereof. In the light-emitting device 100b, the light is actively emitted to the upper surface thereof by the reflective layer 61. The reflective layer 61 is formed in the same manner as the reflective layer 60.

Figure 8D:
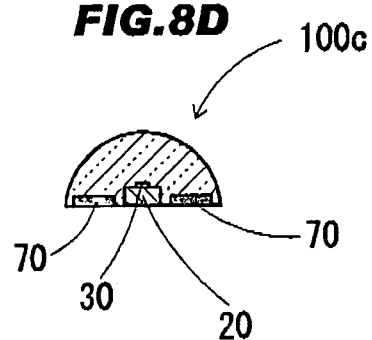
Figure 8E:
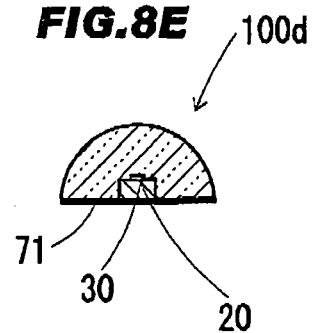

Alternatively, a phosphor layer may be provided on a portion of the lower surface of the light-emitting device. FIG. 8(D) shows a light-emitting device 100c provided with a phosphor layer on a portion of the lower surface thereof. The light-emitting device 100c includes a phosphor layer 70 on a portion of a lower surface, i.e., a surface on the side where the substrate 20 is exposed. The phosphor layer 70 can be formed in the mold form placing process S2 by placing phosphors in a region of the bottom of the concave portion 41 of the mold form 40 where the substrate 20 is not arranged, i.e., a window portion. According to the light-emitting device 100c, the phosphor is excited by a portion of the light from the light-emitting element 30, fluorescent light is generated and mixed with the light from the light-emitting element 30. Alternatively, a phosphor layer 71 may be provided on the entire lower surface, as exemplarily illustrated by a light-emitting device 100d shown in FIG. 8(E).

Although a ceramic substrate is used as the substrate 20 in the invention, it is possible to use a metal base substrate or a single crystal (sapphire, Si) substrate.

A side-mounted LED element, which is mounted by bonding with a conductive adhesive so that a side surface thereof is parallel to a mounting substrate, may be used as a LED element. Alternatively, a FU (face-up) type LED element, of course, may be face-up (FU) mounted, and may be flip-chip (FC) mounted via a bump. In case of FU mounting, it is possible to provide a buffer layer made of sol-gel glass, etc., between the LED element and the sealing member in order to prevent collapse of bonding wire.

The following matters are disclosed.

(11) A method of manufacturing a LED lamp formed by sealing a flip-chip type LED element mounted on a substrate with glass, comprising:

a mounting process for mounting the LED element on a first surface of the substrate;

a sealing member preparation process for preparing a glass sealing member; and a sealing process wherein the sealing member is arranged facing the first surface of the substrate, the sealing member is bonded to the substrate by thermal compression, the sealing member is made along the first surface and a side surface of the ceramic substrate, and a second flat surface opposite to the first flat surface is exposed.

(12) The method manufacturing a LED lamp described in (11), comprising:

a substrate placing process for arranging the substrate before the sealing process so as to have a window portion, wherein the window portion is filled with the sealing member in the sealing process.

(13) The method manufacturing a LED lamp described in (12), wherein the substrate is formed in the substrate placing process by arranging a plurality of long objects in parallel.

(14) The method manufacturing a LED lamp described in (13), wherein the plurality of long objects are held in parallel by a frame in the substrate placing process.

(15) A light-emitting device, comprising:

a substrate;

a light-emitting element mounted on a first flat surface of the substrate; and a glass sealing member for sealing the light-emitting element, wherein the sealing member is in contact with the first flat surface and a side surface of the substrate;

a second flat surface of the substrate opposite to the first flat surface is exposed; and a phosphor layer is provided on a portion of a surface where the second flat surface is exposed.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A light-emitting device, comprising:
   a rectangular substrate comprising a ceramic;
   a light-emitting element mounted on a middle of a first flat surface of the substrate;
   and a glass sealing member for sealing the light-emitting element,
   wherein the glass sealing member is in contact with the first flat surface and an entirety of a pair of opposed side surfaces of the substrate, wherein a second flat surface of the substrate opposite to the first flat surface is exposed, and
   wherein a lower surface of the glass sealing member substantially parallel to the second flat surface of the substrate is exposed, the substrate being one of the plurality of similar parallel substrates each having a light-emitting element mounted on a middle of a first flat surface and a similar contact with the glass sealing member, wherein the plurality of substrates are arranged so as to have a window portion between adjacent substrates, and wherein the glass sealing member is filled in the window portion.

2. The light-emitting device according to claim 1, further comprising a reflective film formed on the outer surface of the glass sealing member above the second flat surface of each substrate.

3. The light-emitting device according to claim 1, further comprising a reflective film formed on a surface of the glass sealing member substantially parallel to the second flat surface of each substrate.

4. The light-emitting device according to claim 1, wherein for each substrate, a metal layer is formed on the second flat surface of the substrate, and wherein a heat sink is connected to an end portion of the metal layer.

5. The light-emitting device according to claim 1, wherein said glass sealing member is formed in a rectangular shape in a plan view.

6. The light-emitting device according to claim 1, wherein along an arrangement direction of each substrate said glass sealing member is formed with a concave portion.

7. The light-emitting device according to claim 1, wherein each substrate of the plurality of substrate comprises a mounting substrate for mounting the light-emitting element.

8. The light-emitting device according to claim 1, wherein the plurality of the substrates creates a plurality of long objects arranged in parallel.

9. The light-emitting device according to claim 8, wherein the glass sealing member is formed in a lens shape along a longitudinal direction of each substrate.

10. The light-emitting device according to claim 9, wherein an outer surface of the glass sealing member along the longitudinal direction of each substrate is formed in a cylindrical lens shape.

11. A light-emitting device, comprising:
    a plurality of rectangular substrates comprising a ceramic and having a reed shape, the reed shape extending in a first direction; wherein
    each substrate has a light-emitting element mounted on a middle of the substrate;
    a glass sealing member formed around each substrate, the glass sealing member having a concave portion provided along the first direction, wherein a second surface of each substrate, opposite to a first surface of each substrate, is exposed, wherein a lower surface of the glass sealing member substantially parallel to the second flat surface of each substrate is exposed, and wherein the plurality of substrates are positioned in parallel such as to have a window portion filled with the glass sealing member between adjacent substrates.

12. The light-emitting device according to claim 11, further comprising a phosphor formed on a portion of the lower surface of the glass sealing member on a side of the second surface of each substrate.

13. The light-emitting device according to claim 11, wherein the glass sealing member functions as a heat extracting portion to conduct heat of each of the light-emitting elements to an outside portion.

14. The light-emitting device according to claim 11, wherein the glass sealing member covers the first surface of each substrate and contacts an entirety of a pair of opposed side surfaces of each substrate.

15. The light-emitting device according to claim 14, wherein the glass sealing member wraps around each substrate and the light emitting element mounted on the substrate.

16. The light-emitting device according to claim 14, wherein the glass sealing member is bonded to each substrate and the light emitting element mounted on the substrate.

17. The light-emitting device according to claim 14, wherein the second surface of each substrate is arranged as opposite to the first surface of the substrate.

18. The light-emitting device according to claim 14, wherein the second surface of each substrate is not covered by the sealing glass member.

* * * * *